(12) United States Patent
Natori

(10) Patent No.: US 6,970,293 B2
(45) Date of Patent: Nov. 29, 2005

(54) SOLID STATE IMAGING DEVICE

(75) Inventor: Taichi Natori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/816,411

(22) Filed: Apr. 1, 2004

(65) Prior Publication Data
US 2004/0196563 A1 Oct. 7, 2004

(30) Foreign Application Priority Data
Apr. 3, 2003 (JP) .............................. 2003-100750

(51) Int. Cl.⁷ ...................... G02B 27/10; H01L 27/148; H01L 31/062; H01L 31/0232; H01L 27/00
(52) U.S. Cl. ...................... 359/626; 359/619; 359/622; 257/232; 257/294; 257/432; 250/208.1
(58) Field of Search ............................... 359/626, 619, 359/621, 622, 800, 802; 257/232, 223, 258, 257/294, 432, 435, 233; 250/338.4, 208.1

(56) References Cited

U.S. PATENT DOCUMENTS

| 5,248,884 A | * | 9/1993 | Brewitt-Taylor et al. | 250/338.4 |
| 5,661,608 A | * | 8/1997 | Barbier et al. | 359/800 |
| 6,069,350 A | * | 5/2000 | Ohtsuka et al. | 250/208.1 |
| 6,295,165 B1 | * | 9/2001 | Nemoto et al. | 359/622 |
| 6,344,928 B1 | * | 2/2002 | Honguh et al. | 359/621 |
| 6,518,640 B2 | * | 2/2003 | Suzuki et al. | 257/432 |
| 6,690,049 B2 | * | 2/2004 | Suzuki et al. | 257/294 |
| 6,730,840 B2 | * | 5/2004 | Sasaoka et al. | 136/246 |
| 6,816,313 B2 | * | 11/2004 | Hara | 359/626 |
| 2004/0159774 A1 | * | 8/2004 | Mishina et al. | 250/208.1 |

FOREIGN PATENT DOCUMENTS

JP 1-213079 8/1989

* cited by examiner

Primary Examiner—Loha Ben
(74) Attorney, Agent, or Firm—Robert J. Depke; Trexler, Bushnell, Giangiorgi, Blackstone & Marr

(57) ABSTRACT

In a solid state imaging device, sensitivity deterioration (shading) of the periphery of the imaging region is planned to be improved. An on-chip micro lens 28 corresponding to each sensor portion 23 in an imaging region 42 is comprised and the center of the reduction magnification of the exit pupil correction which is performed for the on-chip micro lens 28 is set to a position O deviated from the center of the imaging region 42.

4 Claims, 7 Drawing Sheets

SOLID STATE IMAGING DEVICE

BACKGROUND OF THE INVENTION

1. Field of the Invention

The present invention relates to a solid state imaging device.

2. Description of the Related Art

Heretofore, in an imaging camera such as a video camera or a digital still camera, a solid state imaging device is widely used. An exit pupil which is determined by a diaphragm of the lens used in an imaging camera does exist. In an imaging camera, an exit pupil distance which is a distance from the lens focal point to the exit pupil is finite, so that the principal ray which enters the solid state imaging device is inclined as the position is made away from the center of the optical system to the periphery thereof and the incident angle becomes larger.

FIG. 9 shows one example of a solid state imaging device. In this CCD solid state imaging device 1, a plurality of sensor portions 2 by means of photodiode are laid out and formed in a matrix form in an imaging region on a silicon semiconductor substrate 1 and it is constituted such that a vertical transfer register 3 of a CCD structure is formed at each sensor portion row. The vertical transfer register 3 is formed by arranging is formed by laying out a plurality of transfer electrodes 6 through a gate insulation film 5 on a transfer channel 4 in a transfer direction. A light shielding film 9 is formed through an insulation film 8 on the vertical transfer register 3 so as to coat thereof. Additionally, an in-layer lens (concave lens for this example) 12 is formed by a reflow film (insulation film) 10 and a flat formed film (insulation film) 11 which have different refraction indexes each other corresponding to each sensor portion 2. Further, an on-chip micro lens 15 is formed over the in-layer lens 12 through a color filter 13 and flat formed film 14 corresponding to each sensor portion 2.

In a solid state imaging device 1 of such a constitution, if the laid out pitches of the sensor portion 2 and the on-chip micro lens 15 are equal to each other, that is, if the on-chip micro lens 15 exists just over the sensor portion 2, the incident light L which enters the on-chip micro lens 15 at the periphery of the imaging region (see FIG. 9) is not focused to the center of the sensor portion 2 and it is shaded by the light shielding film 9 formed adjacent to the sensor portion 2 such that a sensitivity deterioration is caused. This becomes a cause of a sensitivity irregularity of a picture screen called as shading.

As a technology for correcting this shading, a method is generally used where the laid out pitch of the on-chip micro lens 15 is made smaller than the laid out pitch of the sensor portion 2 as shown in the patent reference 1. To be more concrete, as shown in FIG. 10, it is realized by performing a reduction magnification on the laid out pitch of the on-chip micro lens 15 centering the optical center of the solid state imaging device (center of the imaging region 17 in FIG. 10). With respect to the reduction magnification in this case, the laid out pitch of the on-chip micro lens is reduced by an equal magnification all over the imaging region. In this manner exit pupil correction is performed and as shown in FIG. 11, the incident light L which enters the on-chip micro lens 15 is made focused to the sensor portion 2 even at the periphery of the imaging region.

Also, a solid state imaging device has come to be installed in a mobile apparatus such as a mobile telephone and a personal information mobile terminal and an optical system where the exit pupil distance is very short has been used for miniaturization. For this reason, the light incident angle to the periphery pixels becomes moreover larger and the technology of the exit pupil correction for the on-chip micro lens has becomes more and more important.

In recent years, in addition to the conventionally used CCD image sensor for a solid state imaging device, a CMOS image sensor has come to be installed in a video camera, a digital still camera and a mobile apparatus for the reasons such as "accumulated manufacturing technology of the MOS structure can be used" and "the power consumption is low". In this CMOS image sensor, it is necessary to arrange wiring layers of such as aluminum three dimensionally in the pixels for the reason such that each pixel has several transistors. In a CMOS image sensor, since there exists wirings of layers equal to or more than 2 as described, it is general to perform the light shielding between the pixels by the wiring of the uppermost layer for preventing the color mixture and the like. Further, it is necessary to arrange the readout gate which is the signal line within each pixel in order to read out the electric charge for every pixel.

FIG. 4 shows a conceptual constitution of an imaging region in a CMOS image sensor. A CMOS image sensor 21 is constituted by providing an imaging region where a plurality of sensor portions 23 by means of photodiodes are formed in a matrix form on a semiconductor substrate 22, one pixel is formed between this sensor portion 23 and a plurality of MOS transistors, an insulation film 24 between wiring layers of multiple layers which correspond to wiring layers 251, 252 and 253 of a first layer, a second layer and a third layer in this example are formed through an interlayer insulation film 24, and further, an on-chip micro lens 28 corresponding to a color filter 27 and rectangular sensor portion 23 thereon is formed through a flat formed layer 26. According to this CMOS image sensor 21, for example, the vertical signal line corresponds to a wiring layer 251 of the first layer; the horizontal reset line, the vertical readout line and vertical selection line correspond to a wiring layer 252 of the second layer; and the power supply line corresponds to a wiring layer 253 of the third layer. In this CMOS image sensor 21, the exit pupil correction of the on-chip micro lens 28 is also performed similarly as in FIG. 10.

Here, the form of the sensor portion and the opening shape of the light shielding film respectively will not become symmetrical in the vertical direction or the horizontal direction owing to the arrangement of the readout gates and the wiring layers. In this case, if an exit pupil correction for the on-chip micro lens is performed according a conventional manner, a constant correction is performed with respect to the distance from the optical center of the imaging device, so that places where sensitivity is especially deteriorated resulted from the sensor portion shape or the opening shape of the light shielding film cannot be avoided from existing.

[Patent Reference 1]

JP Laid-open Publication No. 01-213079

Now, for example, in case when the opening of the light shielding film 32 is formed by a wiring layer 253 a of the uppermost layer and a CMOS image sensor has a sensor portion 23 of a shape where the left lower corner portion of a square shape is shielded obliquely as shown in FIG. 5, the sensitivity of each place becomes as shown in FIG. 5 when an optimum exit pupil correction is performed at the left upper and lower positions <2>, <3> and at the right lower corner position <4> on the imaging region (picture screen) 31 (see FIG. 6). More specifically, the sensitivity deterioration at the right upper corner position <1> of the picture screen 31 is remarkable.

Since a light L1 enters the position <1> from the direction which is obliquely light-shielded at the opening of the light shielding film, the light moreover increases, because it is shaded by the oblique light shielding portion 32 shown as a bold line portion in FIG. 5 when the exit pupil correction of the on-chip micro lens 28 is performed. Conversely, in case when the exit pupil correction amount of the on-chip micro lens 15 is optimized at the position <1>, it can be easily imagined that the sensitivity deterioration at the positions <2>, <3> and <4> are remarkable. When it is installed in an optical system in which the exit pupil distance is short such as for a mobile apparatus, the phenomenon appears more notably, so that the problem is serious.

According to another example, in a case of a CMOS image sensor having a sensor portion 23 of a shape where the left lower corner side is light-shielded obliquely and vertically as shown in FIG. 7, the sensitivity of each position when an optimum exit pupil correction is performed at the right upper and lower corner positions <1>, <4> and at the left upper corner position <2> on the imaging region (picture screen) 31 (see FIG. 8) becomes as shown in FIG. 8. More specifically, the sensitivity deterioration is remarkable at the position <3> of the picture screen 31.

Since the focusing position for the position <3> is deviated to a portion 32 which does not function as the sensor portion 23 of FIG. 7, a shaded light will occur. Conversely, when the exit pupil correction amount of the on-chip micro lens 28 is made optimized at the position <3>, it is easy to imagine that the sensitivity deterioration becomes remarkable at the position <1>, <2> and <4>.

For such shading, correction cannot be achieved by a conventional exit pupil correction of the on-chip micro lens any more and it happens that a remarkably dark place does exist in a picture screen. Further, the shading amount is not constant with respect to the distance from the center of the picture screen, it is difficult to apply a shading correction technology other than the exit pupil correction of the on-chip micro lens such as a technology in which a shading correction is performed by making the periphery of the picture screen bright electrically.

As mentioned above, a technology in order to propose a solid state imaging device where non-uniform shading which is resulted from the asymmetrical shape of the sensor portion and the shape of the opening of the light shielding film is corrected with respect to the distance from the center of the picture screen, the shading amount is made to be uniform with respect to the center of the picture screen and at the same time the sensitivity irregularity is reduced as a result so as to improve its sensitivity has been desired.

SUMMARY OF THE INVENTION

In view of the aforementioned point, the present invention proposes a solid state imaging device where the sensitivity deterioration (shading) is planned to be improved.

A solid state imaging device according to the present invention comprises an on-chip micro lens corresponding to each sensor portion in an imaging region, wherein the center of the reduction magnification of the exit pupil correction which is performed for the on-chip micro lens is constituted to be set to a position deviated from the center of the imaging region.

In the solid state imaging device according to the present invention, the center of the reduction magnification of the exit pupil correction which is performed for the on-chip micro lens is set to a position deviated from the center of the imaging region, so that the shading amount with respect to the distance from the picture screen center becomes uniform for the solid state imaging device which includes a sensor portion in an asymmetrical shape and an opening of a light shielding film.

DESCRIPTION OF THE PREFERRED EMBODIMENTS

Exemplified embodiments of the present invention will be explained with reference to the drawings hereinafter.

The solid state imaging device according to the exemplified embodiment is constituted such that a plurality of sensor portions are laid out in a matrix form and an imaging region in which on-chip micro lenses are laid out corresponding to at least the sensor portions respectively wherein the center of the reduction magnification of the exit pupil correction which is performed for the on-chip micro lens is set to a position deviated from the center of the imaging region. The reduction magnification of the on-chip micro lens can be designed to be constant with respect to the distance from the center of the reduction magnification and more specifically the laid out pitch of the on-chip micro lenses can be designed to be constant all over the imaging region or can be designed to change with respect to the distance from the center of the reduction magnification and more specifically the laid out pitch of the on-chip micro lenses can be designed to be different according to the distance. In case when the reduction magnification of the on-chip micro lens is made to change with respect to the distance from the center of the reduction magnification, it can be changed continuously or in a step shape according to that distance.

In other words, according to the exemplified embodiment, the deviated amount of the on-chip micro lens is set to be an optimum deviated amount according to the pixel position (accordingly, the position of the sensor portion) with respect to the distance from the center of the imaging region. In the exemplified embodiment, it is applicable when the sensor portion or the opening of the light shielding film is an asymmetrical shape. It should be noted that it is applicable also when a sensor portion or an opening of the light shielding film which is in a symmetrical shape is included.

Figure 1:
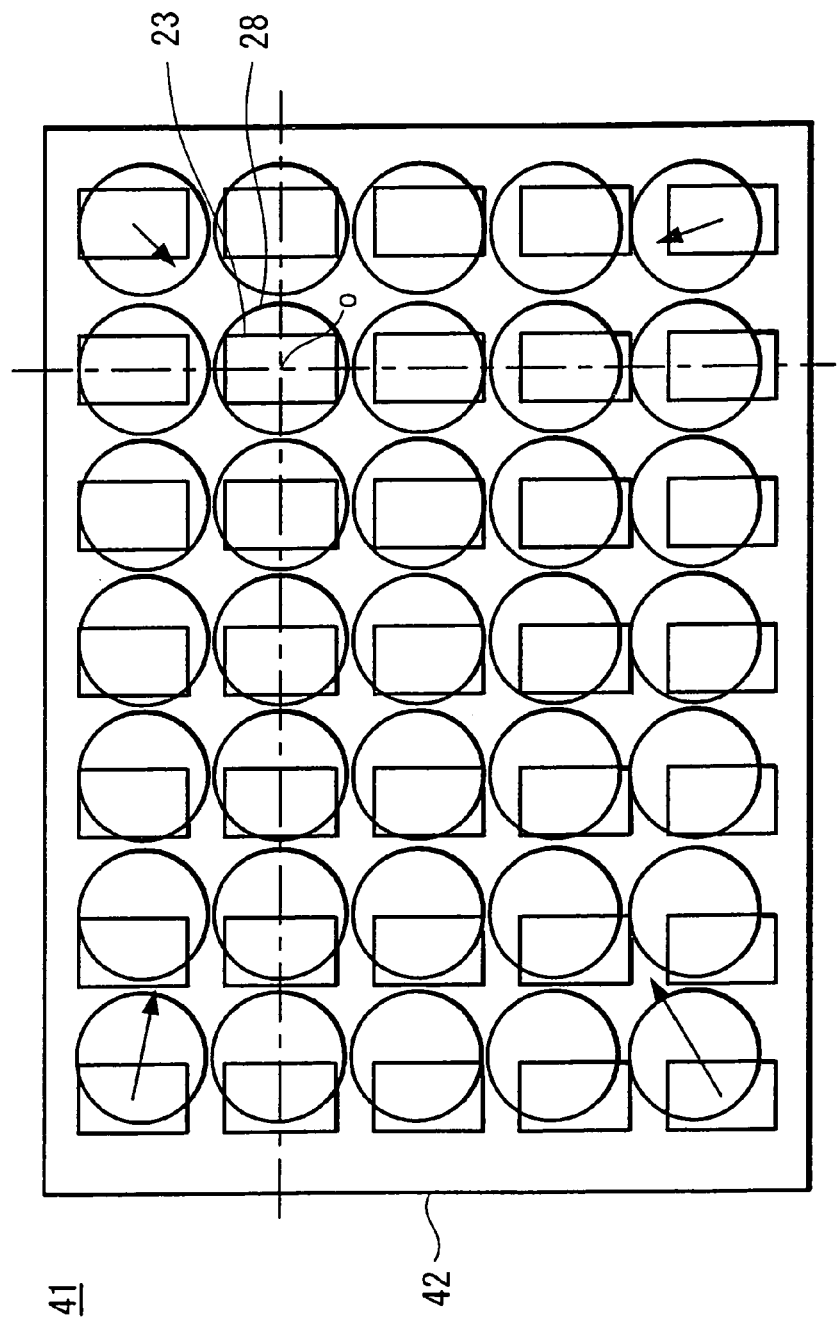
FIG. 1 is a conceptual constitution diagram of an imaging region showing one exemplified embodiment of a solid state imaging device according to the present invention.
Figure 5:
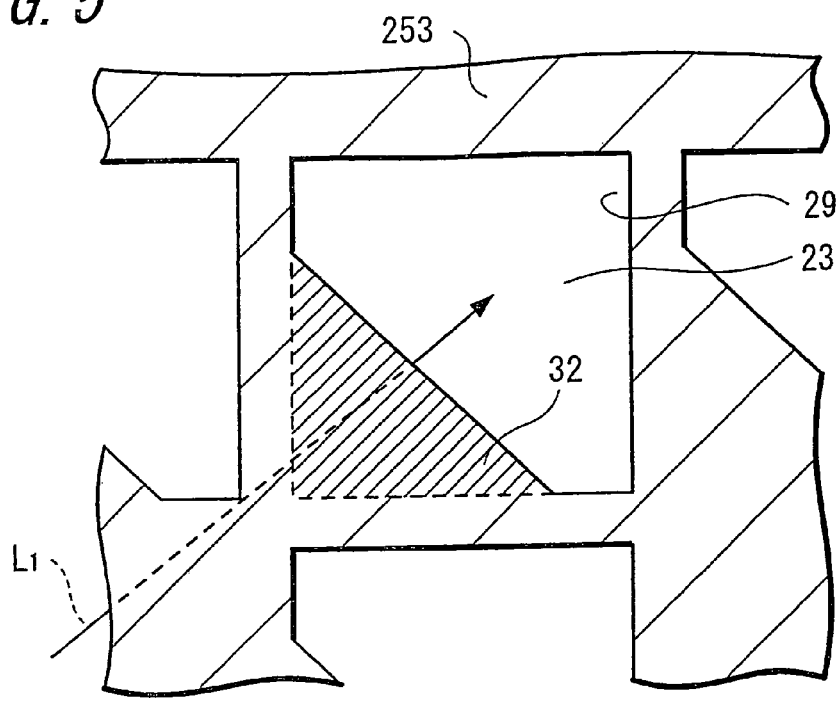
FIG. 5 is an enlarged plan view of a relevant part showing one example of an opening of a light shielding film shape in a CMOS image sensor.
Figure 6:
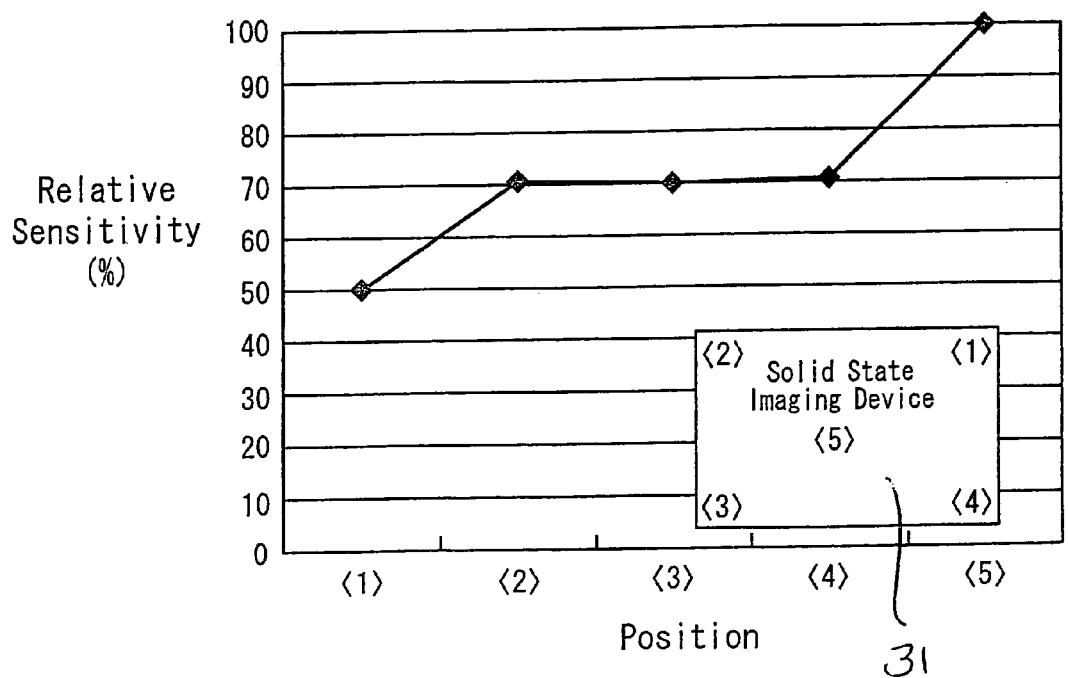
FIG. 6 is a graph showing a relation between each position of an imaging region and a relative sensitivity in a CMOS image sensor of FIG. 5.

FIG. 1 shows one exemplified embodiment according to the present invention. A solid state imaging device 41 according to the exemplified embodiment is shown as being to applied to a CMOS image sensor and is constituted to have a sensor portion 23 of an asymmetrical shape in which the left lower corner portion is shielded obliquely by means of a wiring layer of the uppermost layer and another wiring layer similarly as shown in FIG. 5 mentioned above. In order to reduce the shading of the incident light L1 at the portion in which the left lower corner portion is light-shielded (for example, portion 32 in FIG. 5), it is necessary to make the exit pupil correction amount of the on-chip micro lens corresponding to the pixel of the right upper corner position <1> of the imaging region (pixel region) smaller compared with the exit pupil correction amount of the on-chip micro lens corresponding to the pixels of the right lower corner position <4> of the imaging region and the left upper and lower corner positions <2>, <3>.

In the exemplified embodiment, as shown in FIG. 1, a reduction magnification is carried out with respect to the on-chip micro lenses 28 by making the center $\underline{O}$ at the right upper portion of the imaging region 42 compared with the optical center of the imaging region 42. More specifically, the position at which the center of the sensor portion 23 coincides with the center of the on-chip micro lens 28 becomes a right upper center $\underline{O}$. In this example, the laid out pitches of the on-chip micro lenses 28 in the vertical direction and in the horizontal direction are reduced by an equal pitch toward that center $\underline{O}$.

In the exemplified embodiment, as shown in FIG. 1, a fewer amount of the exit pupil correction can be performed at the right upper corner position <1> compared with those at the left upper corner position <2>, at the left lower corner position <3> and at the right lower corner position <4> with respect to the imaging region 42. Here, how much the center of the reduction magnification correction should be deviated can be determined, for example, according to a result after carrying out an optical simulation with respect to each position.

Here, specifically a case where a CMOS image sensor having an imaging region of a diagonal 5 mm and an aspect ratio 3:4 is combined with a lens having an optical system of an exit pupil distance 6 mm and an F value 2.8 will be considered. It is assumed that the opening shape of the light shielding film is similar as that in FIG. 5 mentioned above and a light shielding film exists at the position of 6 μm from the sensor portion.

Figure 2:
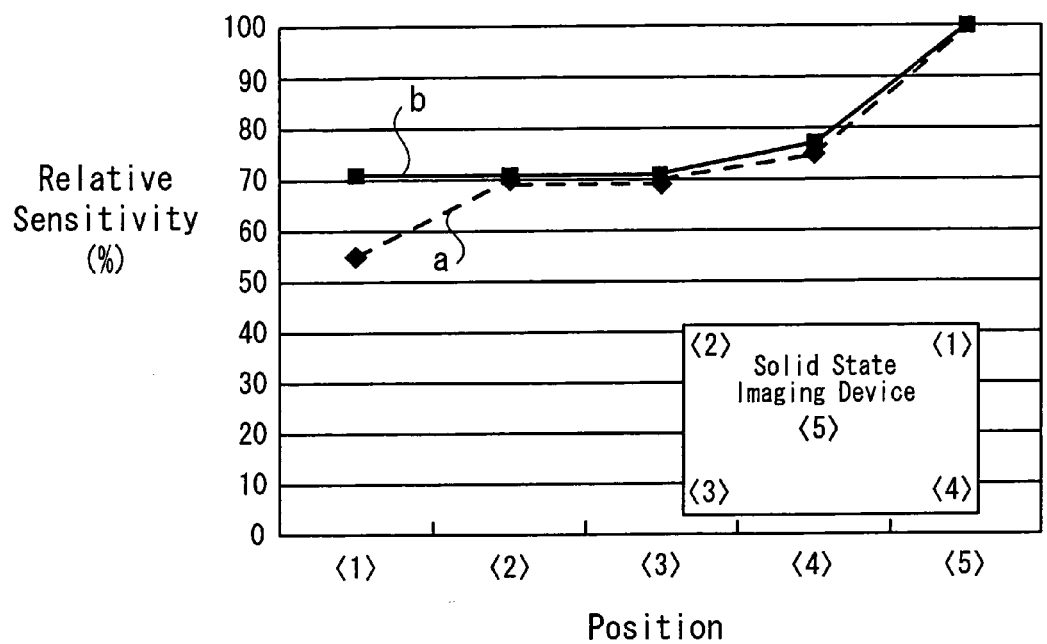
FIG. 2 is a graph showing a relation between each position of an imaging region and a relative sensitivity in one exemplified embodiment of a solid state imaging device according to the present invention.

When the exit pupil correction of the conventional on-chip micro lens is optimized at the position <3> in this system, the sensitivity of the respective positions <1>, <2>, <3> and <4> becomes as shown as a dotted line $\underline{a}$ in FIG. 2. On the other hand, when the exemplified embodiment of FIG. 1 is applied, the sensitivity of the respective positions <1>, <2>, <3> and <4> becomes as shown as a solid line $\underline{b}$ in FIG. 2. More specifically, the sensitivity becomes approximately uniform at the periphery of the imaging region. Here, the reduction magnification correction is performed centering a position which is deviated 0.18 mm horizontally and 0.14 mm longitudinally from the center of the imaging region.

Figure 7:
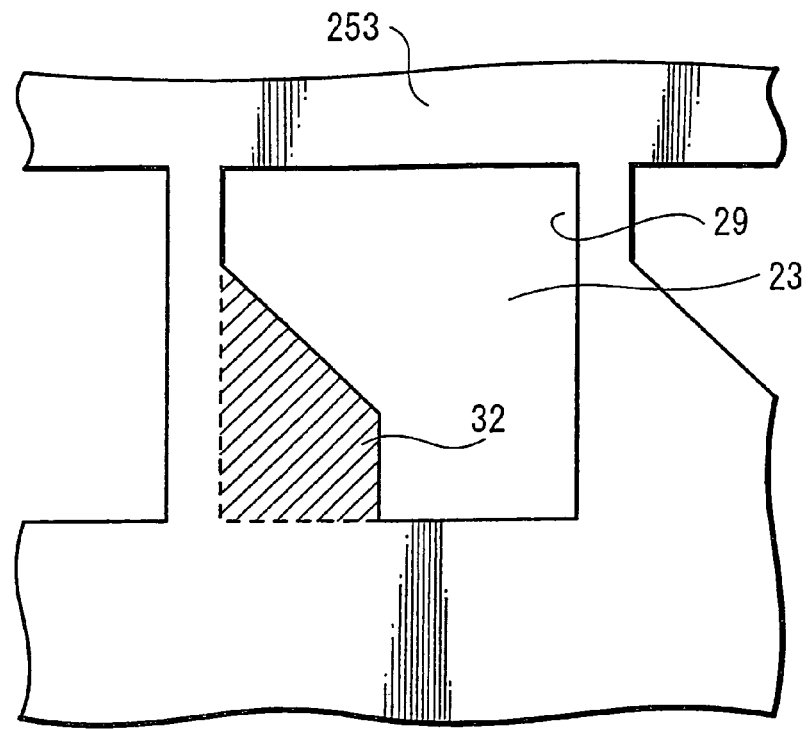
FIG. 7 is an enlarged plan view of a relevant part showing another example of an opening of a light shielding film shape in a CMOS image sensor.
Figure 8:
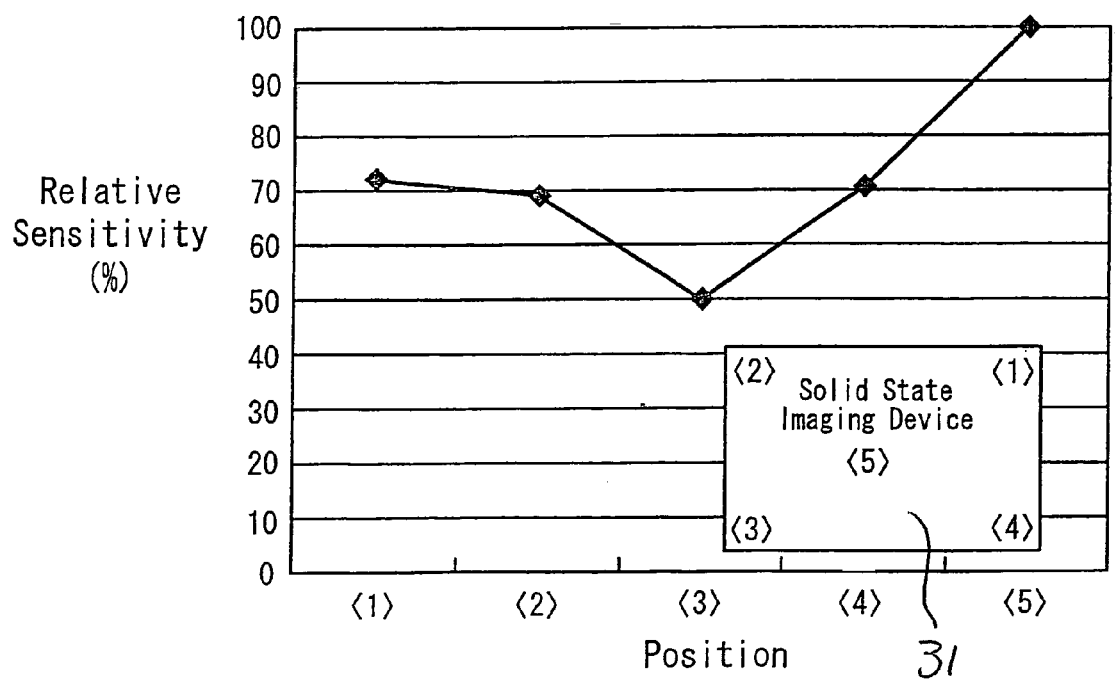
FIG. 8 is a graph showing a relation between each position of an imaging region and a relative sensitivity in a CMOS image sensor of FIG. 7.
Figure 9:
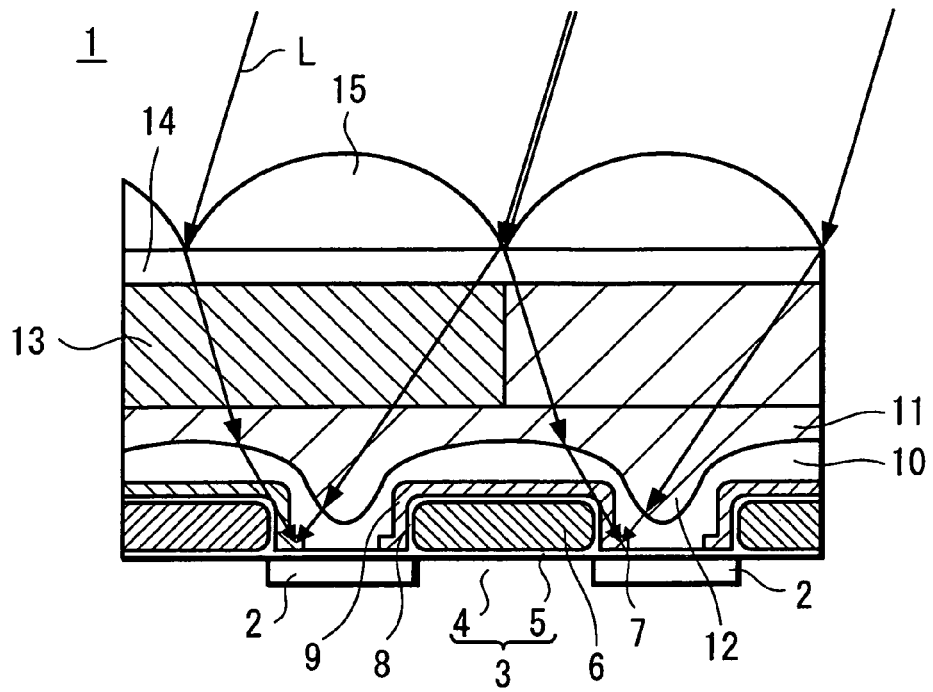
FIG. 9 is a cross sectional diagram showing a conceptual constitution of a CCD image sensor.
Figure 11:
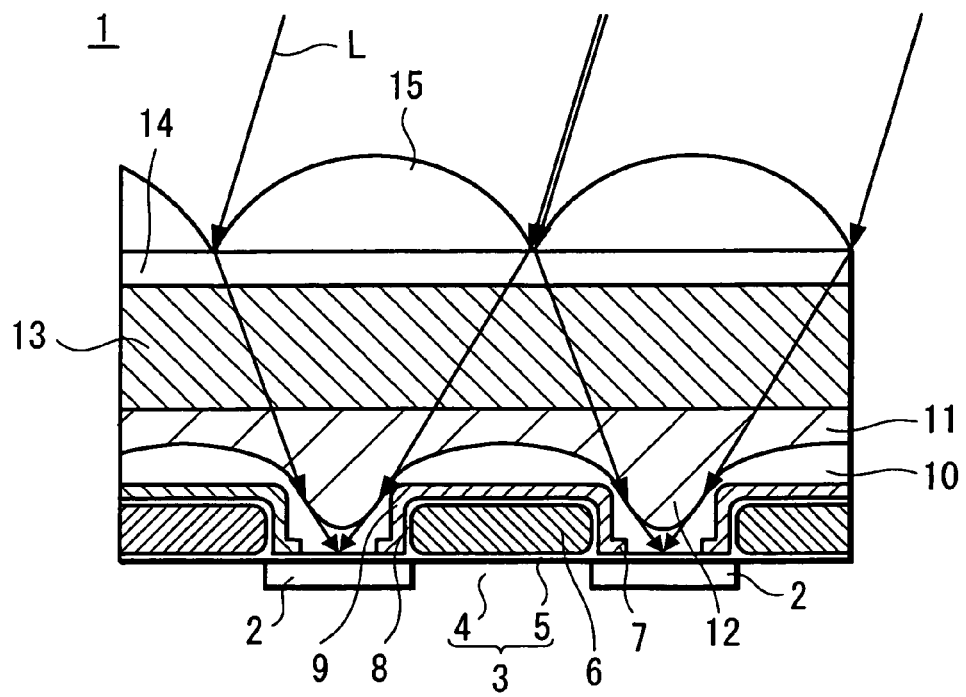
FIG. 11 is a cross sectional diagram at a periphery of a CCD image sensor where an exit pupil correction is performed.
Figure 10:
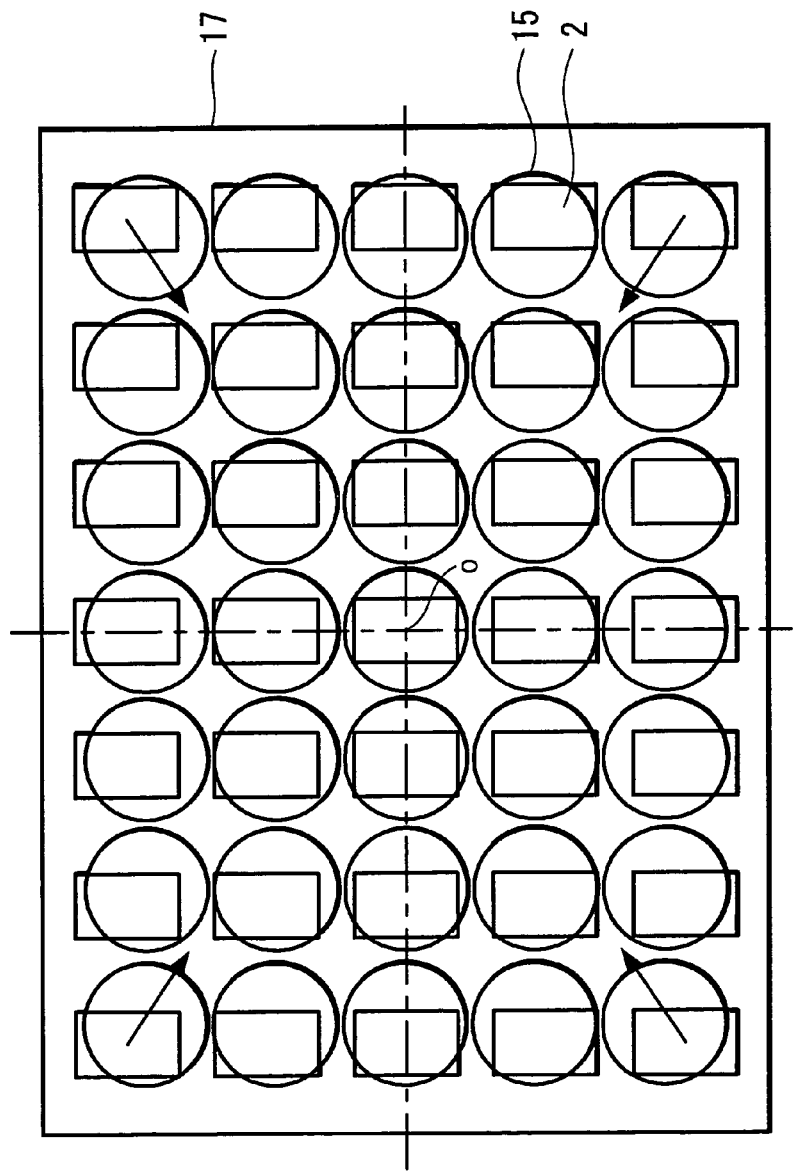
FIG. 10 is a conceptual constitution diagram of an imaging region in a CCD image sensor.

Another example according to the exemplified embodiment will be shown. A CMOS image sensor having a sensor portion of an asymmetrical shape similarly as that in FIG. 7 mentioned above will be considered. In this case, in order to reduce the shading of the incident light L1 at the obliquely light-shielded portion (for example, portion 32 in FIG. 9), it is necessary to make the exit pupil correction amount of the on-chip micro lens smaller at the left lower corner position <3> as compared with those at the positions <1>, <2> and <4>. Consequently, the reduction magnification is performed with respect to the on-chip micro lens centering a position which is left lower than the optical center of the imaging region though it is not shown. More specifically, the position at which the center of the sensor portion 23 coincides with the center of the on-chip micro lens becomes a left lower center $\underline{O}$ of the imaging region. In this example, the laid out pitches of the on-chip micro lenses in the vertical direction and in the horizontal direction are reduced by an equal pitch toward that center $\underline{O}$.

In the exemplified embodiment, a fewer amount of the exit pupil correction can be performed at the position <3> compared with those at the positions <1>, <2> and <4>. In this case, too, how much the center of the reduction magnification correction should be deviated can be determined, for example, according to a result after carrying out an optical simulation with respect to each position.

Here, similarly as the above example, an example where a CMOS image sensor having an imaging region of a diagonal 5 mm and an aspect ratio 3:4 is combined with a lens having an optical system of an exit pupil distance 6 mm and an F value 2.8 will be considered. It is assumed that the opening shape of the light shielding film is similar as that in FIG. 7 and a light shielding film exists at the position of 6 μm from the sensor portion.

Figure 3:
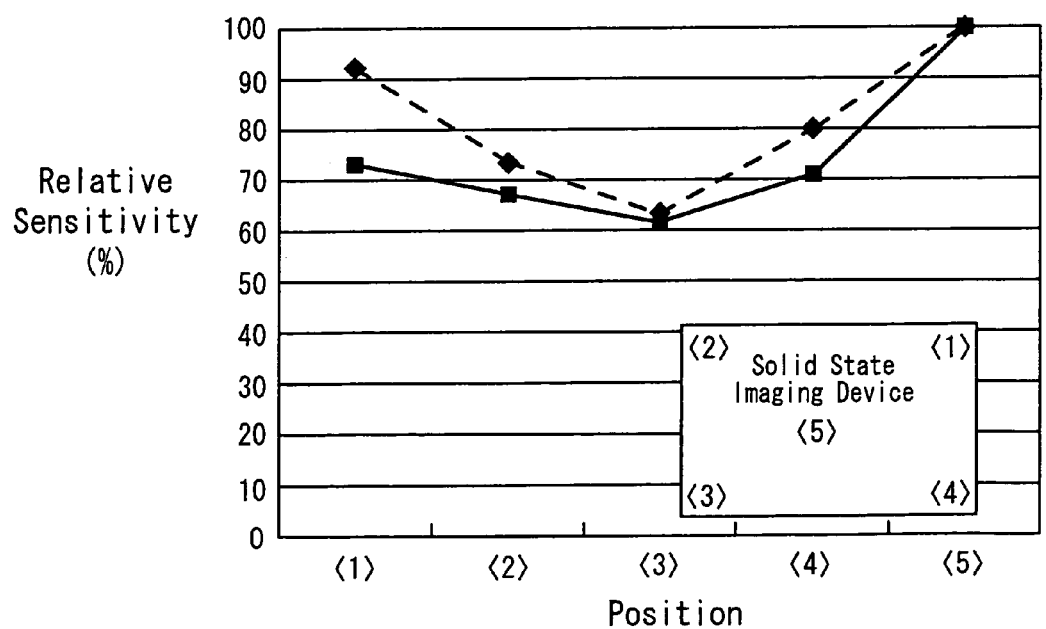
FIG. 3 is a graph showing a relation between each position of an imaging region and a relative sensitivity in another exemplified embodiment according to the present invention.
Figure 4:
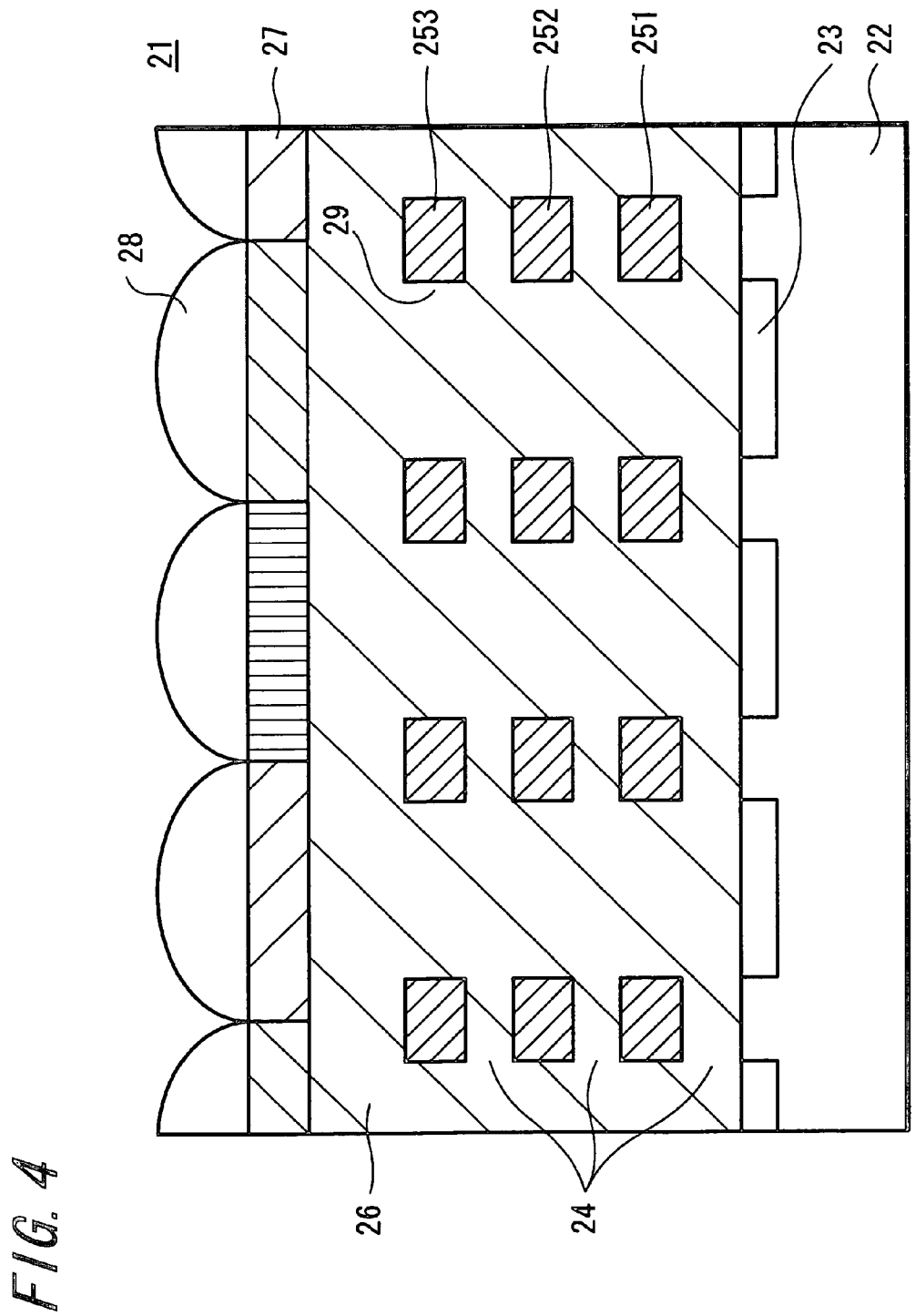
FIG. 4 is a cross sectional diagram showing a conceptual constitution of a CMOS image sensor.

When the exit pupil correction of the conventional on-chip micro lens is optimized at the position <3> in this system, the sensitivity of the respective positions <1>, <2>, <3> and <4> becomes as shown as a dotted line $\underline{c}$ in FIG. 2. On the other hand, when the exemplified embodiment is applied, the sensitivity of the respective positions <1>, <2>, <3> and <4> becomes as shown as a solid line $\underline{d}$ in FIG. 3. More specifically, the sensitivity becomes approximately uniform at the periphery of the imaging region. Here, the reduction magnification correction is performed centering a position which is deviated −0.26 mm horizontally and −0.2 mm longitudinally from the center of the imaging region.

According to the solid state imaging device relating to the above mentioned exemplified embodiment, the shading amount can be made to be uniform with respect to the distance from the center of the picture screen in a solid state imaging device having a sensor portion of an asymmetrical shape or an opening of the light shielding film by setting the center of the reduction magnification correction at a deviated position from the optical center of the imaging region when the exit pupil correction of the on-chip micro lens is performed. Consequently, it is possible to reduce the sensitivity irregularity and to improve its sensitivity. In this manner, it can be avoided from the non-uniform shading characteristic such as darkness at a specific corner in the picture screen. Thus, it becomes easy to adopt a shading correction in which the signal level at the periphery of the picture screen is raised electrically and the like.

The formation of the on-chip micro lens can be realized generally by using a photolithography method where a light sensitive resin is processed with an exposure, an image development and a heat reflow. The arrangement of the on-chip micro lenses is determined at the exposure time for forming the on-chip micro lens pattern, so that the introduction of the present invention can be achieved by preparing a mask which is processed with a reduction magnification centering a position deviated from the optical center of the imaging region beforehand.

It was explained in the above example about the application to the CMOS image sensor, but it is similarly possible to apply to the CCD image sensor or other image sensors and the application itself is not limited.

According to the present invention, a high quality imaging camera such as a video camera, a digital still camera and the like or a high quality mobile apparatus such as a mobile telephone, a personal information mobile terminal and the like can be constituted by installing the solid state imaging device mentioned above where the shading is improved.

According to the solid state imaging device relating to the present invention, the shading amount can be made to be uniform with respect to the distance from the center of the picture screen by setting the center of the reduction magnification correction at a deviated position from the optical center of the imaging region when the exit pupil correction of the on-chip micro lens is performed. Consequently, it is possible to reduce the sensitivity irregularity and to improve its sensitivity.

It is suitable to apply the present invention especially to a solid state imaging device having a sensor portion of an asymmetrical shape or an opening of the light shielding film.

When the reduction magnification of the on-chip micro lens is designed to be constant with respect to the distance from the center of the reduction magnification, the manufacturing process will become easier. When the reduction magnification of the on-chip micro lens is designed to be varied with respect to the distance from the center of the reduction magnification, the exit pupil correction will become better.

When the reduction magnification of the on-chip micro lens is also designed to be varied continuously or in a step shape with respect to the distance from the center of the reduction magnification, the exit pupil correction will become better.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state imaging device comprising:
    a plurality of on-chip lenses each having a corresponding sensor portion in an imaging region;
    wherein a primary lens registration location is selectively located at a region of the imaging device depending on a physical characteristic of the imaging element structure which is deviated from a center of said imaging region.

2. A solid-state imaging device according to claim 1, wherein a surface of said sensor portion or an opening of a light shielding film is in an asymmetrical shape.

3. A solid-state imaging device according to claim 1, wherein locations for said plurality of on-chip lenses are constant or are varied with respect to a distance from said center of the primary lens registration location.

4. A solid-state imaging device according to claim 1, wherein locations for said plurality of on-chip lenses are varied continuously with respect to a distance from said center of the primary lens registration location.

* * * * *